United States Patent [19]

Rittenbach

[11] Patent Number: 4,649,393

[45] Date of Patent: Mar. 10, 1987

[54] PHASED ARRAY ANTENNAS WITH BINARY PHASE SHIFTERS

[75] Inventor: Otto E. Rittenbach, Neptune, N.J.

[73] Assignee: The United States of America as represented by the Secretary of the Army, Washington, D.C.

[21] Appl. No.: 581,496

[22] Filed: Feb. 17, 1984

[51] Int. Cl.[4] .......................... H01Q 3/22; H01Q 3/02; H03H 7/20

[52] U.S. Cl. .................................... 342/371; 342/374; 342/377; 333/139; 333/164

[58] Field of Search ............... 343/368, 371, 372, 374, 343/778, 777, 377, 754; 363/53; 333/139, 164

[56] References Cited

U.S. PATENT DOCUMENTS

| | | | |
|---|---|---|---|
| 3,276,018 | 9/1966 | Butler | 343/373 |
| 3,525,995 | 8/1970 | Schroeder | 343/777 |
| 4,039,925 | 8/1977 | Fletcher et al. | 363/53 |
| 4,088,970 | 5/1978 | Fassett et al. | 343/373 |

*Primary Examiner*—Theodore M. Blum
*Assistant Examiner*—Gregory C. Issing
*Attorney, Agent, or Firm*—Sheldon Kanars; Jeremiah G. Murray; Maurice W. Ryan

[57] ABSTRACT

Steerable phased array antennas of the tapered type in which the antenna element power is maximum at the center of the array and tapers off on either side thereof. The phase shifters of each antenna element are of the binary digital type with the number of stages and hence the phase accuracy being maximum for the high power center antenna elements and tapering off on either side thereof. Redundant stages for the binary phase shifters can be provided to increase reliability.

8 Claims, 7 Drawing Figures

PHASED ARRAY ANTENNAS WITH BINARY PHASE SHIFTERS

The invention described herein may be manufactured, used and licensed by or for the Government for governmental purposes without the payment to me of any royalties thereon.

BACKGROUND OF THE INVENTION

The invention relates to phased array antennas and more particularly to such antennas which employ binary digital phase shifters between the transmitter/-receiver of the system and the radiator elements of the array. Phased array antennas provide for steering of the antenna beam by controlling the relative phases of the energy applied to the radiating elements of the array. A simple linear array will produce a broadside beam having its direction of maximum radiation, or boresight axis, normal to the direction of the array if the radiating elements all have energy of the same phase applied thereto. If the phases of the energy at the antenna elements progress in a linear manner along the array, an off-broadside beam will result, the direction of which will depend on the phase difference between each adjacent element relative to the spacing thereof. Thus by programming the phase shifters in a predetermined pattern, the beam can be made to scan back and forth around the broadside position. Prior art phased arrays have usually used analog phase shifters which can be adjusted to any desired phase shift in response to a control signal to provide a desired beam scanning pattern. Such continuously variable phase shifters are complex and expensive and often have rather low reliability. Failure of one or more of these phase shifters can seriously degrade the performance of an entire antenna array. A simpler phase shifter has been devised by connecting a plurality of elementary binary digital phase shifters in series. These elementary phase shifters are capable of assuming two different phase shifts, one of which is zero. If several of these elementary binary phase shifters are connected in series, the total phase shift will be the sum of the phase shifts of each individual binary phase shifter. If a series of such elementary phase shifters each have a different "on" phase shift and each phase shifter has twice the "on" phase shift of the preceding adjacent elementary phase shifter, different combinations of the elementary shifters of the series can be switched "on" or "off" to achieve $2^n$ different total phase shifts, with the incremental phase shift equal to that of the "on" phase shift of the first element. For example, suppose three binary phase shifters are connected in series and the first shifter can be switched between 0° and 45°, the second between 0° and 90°, and the third between 0° and 180°. Such a three stage binary digital phase shifter can be switched in increments of 45° from 0° to 315° in eight steps. For many phased array antenna applications this accuracy of phasing of the antenna radiators is sufficient to produce a satisfactory radiation pattern.

In order to reduce the amplitude of antenna pattern sidelobes, phase array antennas often have the power distribution to the array tapered so that the center elements get maximum energy from the transmitter and the side elements are tapered to a minimum energy at the two elements at opposite ends of the array. In such tapered arrays, the low energy end elements contribute relatively little to the far-field radiation pattern and hence the phase accuracy of these elements can be considerably less than that of the high energy center elements. Thus the number of stages and hence the phase accuracy of the binary phase shifters can decrease on either side of the center radiators. Such a tapered phased array with digital phase shifters comprises one aspect of the present invention.

Further, the present invention provides for greater reliability in the operation of phased antenna arrays by providing redundant circuitry for the digital binary phase shifters thereof so that the system can continue operation even though up to 50% of the elementary binary phase shifters stages may become inoperative or stuck at a fixed phase.

Other aspects of the invention comprise a method of optimizing the performance of the antenna arrays disclosed herein when one or more of the phase shifters connected to an antenna radiator becomes inoperative.

SUMMARY OF THE INVENTION

One embodiment of the invention comprises a steerable linear phased array antenna of the tapered type in which the energy applied to the radiators at either end of the array is tapered to provide a low sidelobe pattern, and in which each radiator is provided with binary digital phase shifters each comprising one or more elementary binary phase shifters connected in series, each of said elementary phase shifters being capable of assuming either zero phase shift, 180° phase shift, or some submultiple of 180° which submultiple is an integral power of 2 whereby by selectively controlling the phase shifts of said elementary phase shifters, $2^n$ different total phase shifts may be obtained, where "n" is the number of said elementary binary phase shifters, and wherein the high energy center elements of said antenna array are provided with phase shifters having a greater number of stages of said elementary binary phase shifters than are the lower energy radiators at either end of said antenna array.

In another aspect of the invention, the aforementioned phased array antenna is provided with phase shifters for each antenna radiator which comprise double the number of elementary binary phase shifters, with two binary phase shifters of the same phase shift, whereby the antenna performance will not be impaired if all of the redundant elementary binary phase shifter stages fail.

These and other objects of the invention will become apparent from the following detailed description and the drawings.

DETAILED DESCRIPTION OF A PREFERRED EMBODIMENT

Figure 1:
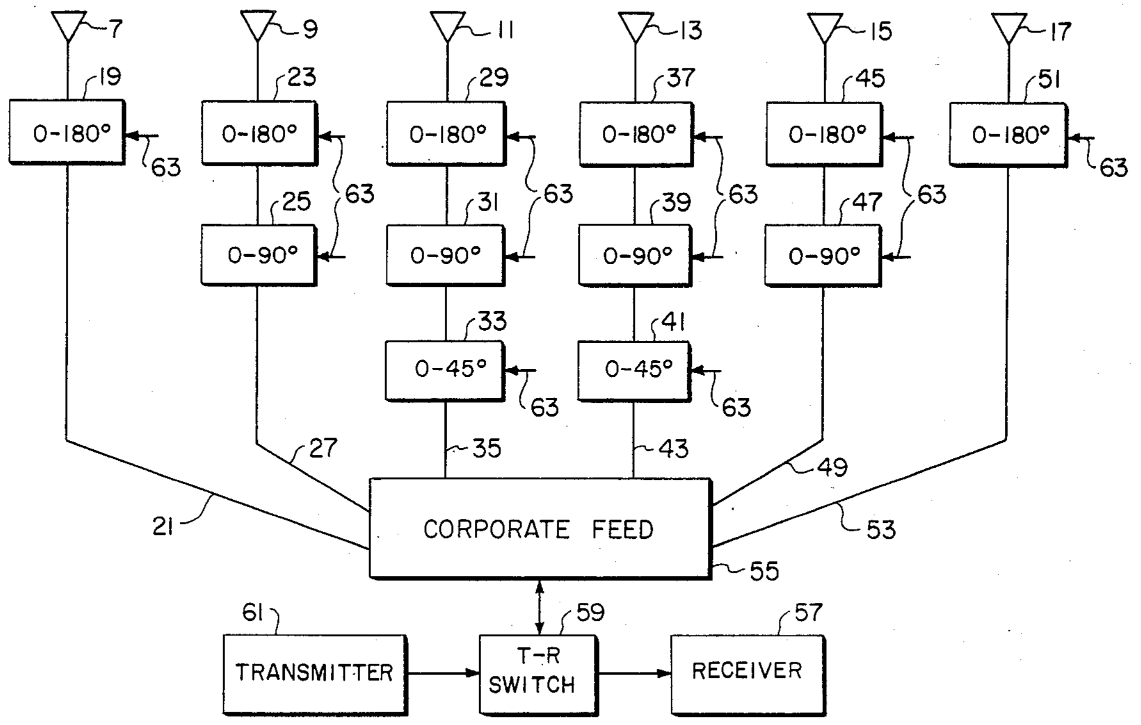
FIG. 1 is a circuit diagram of a radar set with a tapered phased array antenna according to the present invention.

The circuitry of FIG. 1 shows a simplified circuit diagram of one embodiment of the invention as applied to a radar set with a steerable phased array antenna. The simplified array comprises six radiators or antenna elements 7, 9, 11, 13, 15, and 17 arranged side by side to form a linear array. The six radiators are connected to a corporate feed 55 of a type known in the art, which functions as a power splitter or divider for applying the proper transmitter power to each of the array elements to achieve tapering. On a tapered six element array such as that illustrated the two center radiators 11 and 13 would receive maximum and equal energies, the two end radiators 7 and 17 would receive minimum and equal energies, and the two radiators 9 and 15 on either side of the center radiators would receive equal energies which are intermediate that applied to the center and end element radiators.

The antenna elements are provided with binary digital phase shifters of the type described above, and in accordance with one aspect of the invention, the complexity and hence the phase accuracy of the phase shifters of each antenna element depends on the amount of energy handled by each antenna element. In the illustrated example of FIG. 1, the lowest power end elements 7 and 17 are each provided with a single stage binary digital phase shifter, referenced as 19 and 51, respectively. These binary phase shifters are capable of providing either 0° or 180° phase shift depending on the state of the signal on control lead 63. Thus if the control lead 63 has a binary 1 or a voltage thereon, the phase shifter might be set at 180° and if lead 63 has a binary 0 or no voltage thereon, the phase shifter would shift to its other binary state of 0° phase shift. It should be noted that the control leads of all the elementary phase shifter stages are referenced as 63, however all of the signals on these leads are independently controlled by a phase shift control circuit, shown in FIG. 3. The phases of the two low energy end radiators can thus only be either 0° or 180°. Each of the antenna elements of intermediate energy, 9 and 15, are provided with two-stage binary phase shifters; antenna element 9 having elementary phase shifters 23 and 25 in series and element 15 having similar phase shifters 45 and 47. Elementary phase shifters 23 and 45 are of the 0° or 180° type, as illustrated and phase shifters 25 and 47 are of the 0° or 90° phase shift type. Such a two stage binary phase shifter will provide a total phase shift equal to the sum of the phase shifts of its stages and thus the energy applied to radiators 9 and 15 may be phase shifted by 0°, 90°, 180°, or 270°, depending on the binary states of the two series-connected phase shifters connected to these radiators.

The highest power center antenna elements 11 and 13 are provided with three-stage phase shifters. Element 11 having elementary phase shifters 29, 31, and 33 connected in series and having respectively phase shifts of 0°–180°, 0°–90°, and 0°–45°, as illustrated. The antenna element 13 has a similar three stage binary phase shifter comprising phase shifter elements 37, 39 and 41. These three-stage phase shifters are capable of assuming $2^3$ or 8 different discrete values of phase shift, in increments of 45°. Thus the maximum phase shift error of these two center array elements would be 22.5°. The maximum phase errors of the one and two stage phase shifters described above would be 90° and 45°, respectively.

The circuitry and mode of operation of binary digital phase shifters of the type utilized in this invention is known in the prior art and is not complicated or expensive. For example the circuitry may involve within each elementary phase shifter stage two signal paths which differ in phase delay by the phase difference of the two binary phase delays of that stage. The control signal 63 can be arranged to operate an electronic switch, for example a biased diode, to select either one or the other of the signal paths depending on whether lead 63 has a binary 1 or 0 thereon. Thus the "zero" phase shift could and would normally be a multiple of 360°.

The remainder of the radar set circuitry of FIG. 1 is conventional and includes a transmit-receive (T-R) switch 59 with the transmitter 61 and receiver 57 connected thereto. The T-R switch applies the transmitted pulse to the corporate feed for transmission and sequentially connects the target echo signals to receiver 57. The receive antenna patterns will be the same as the transmit patterns, and the corporate feed will apply appropriate weighting factors to the received antenna element signals to produce the desired tapering.

Figure 2:
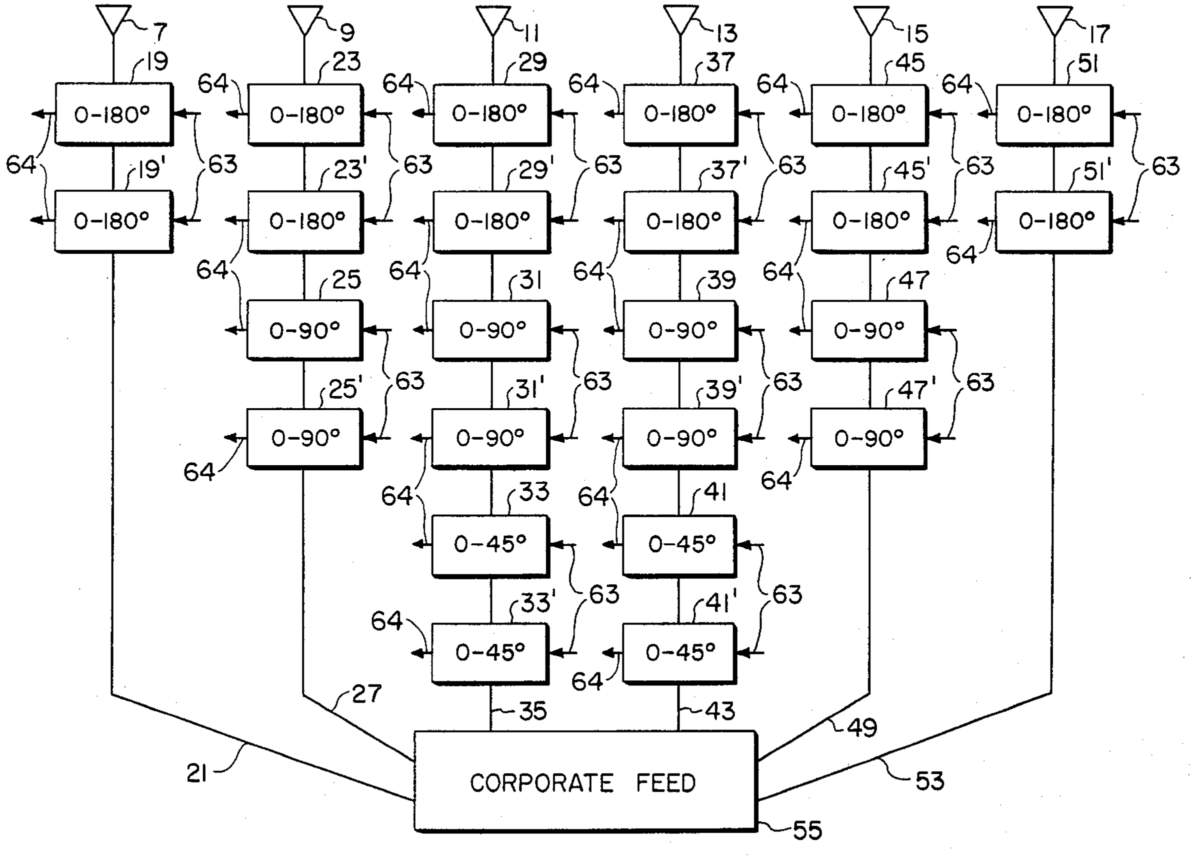
FIG. 2 is a system similar to that of FIG. 1 but with redundant binary digital phase shifters.

The embodiment of FIG. 2 shows a simplified phased array antenna of the tapered energy type like that of FIG. 1 but provided with 100% redundant phase shifters in that each elementary phase shifter of a given value or phase shift is duplicated so that the system can continue functioning in case of failure of all of the redundant elementary phase shifters. For example, the low energy end antenna elements are each provided with two 0°–180° phase shifters, 19 and 19' for element 7, and 51 and 51' for element 17. Similarly the intermediate energy antenna elements 9 and 15 have two-stage phase shifters comprising respectively the 0°–180° phase shifters 23 and 45, and 0°–90° shifters 25 and 47 just as do the same antenna elements of FIG. 1, but in addition are provided with redundant 0°–180° elements 23' and 45' and redundant 0°–90° elements 25' and 47'. In similar fashion, the high energy center antenna elements 11 and 13 are provided with redundant elements 29', 37', 31', 39', 33' and 41' in addition to the basic three elementary stages shown in FIG. 1. In operation, in the absence of any phase shifter failures, all of the redundant phase shifter elements (those with the primed reference numerals) would be set at 0° phase shift so that they would all be ineffective. The basic or non-redundant phase shifter elements, 19, 23, 37, 45, etc. would function as in FIG. 1 to control the antenna element phases. In the event of failure of any of these basic phase shifter elements, the redundant elements can be utilized to permit continuous functioning of the antenna and the radar system. The low cost of these phase shifter elements makes this concept a practical one. For example, the basic elementary phase shifter 19 connected to antenna element 7 of FIG. 2 may fail and become stuck at either of its two phase values, 0° or 180°. If it becomes stuck at 0°, it becomes in effect a short circuit and the redundant unit 19' in series therewith can be then operated by the phase control circuit over lead 63 to perform the function formerly performed by element 19. If 19 becomes stuck at 180° phase, the redundant element 19' can then provide the desired phase to element 7 if the binary control signals 63 applied thereto are the compliments of the signals normally applied to element 19 when it is functioning. Thus if a zero phase is desired at radiator 7, the redundant phase shifter 19' would be set at 180° so that the total phase shift through 19 and 19' would be 360° (or 0°). If 180° phase shift is desired, 19' would be set at 0°. The aforementioned complimentary signals on leads 63 would provide these phases.

Failure of all of the basic elementary shifters of any or all of the other antenna elements of FIG. 2, e.g. the phase shifters connected to antenna elements 9, 11, 13, and 15, at 0° phase can be compensated for by simply switching over to all of the redundant phase shifters. Also, if any single one of the elementary phase shifter stages of these two and three stage phase shifters becomes stuck at its non-zero phase, different combinations of the remaining elementary phase shifters can be switched to provide all of the required phase shifts. For example, assume that the phase shifter 29 becomes stuck at 180°, then the redundant stage 29' is switched to its 180° position with all other stages at 0° to obtain a phase shift of 360° (or 0°). Then the other basic phase shifter stages 31 and 33 are operated in the usual fashion in combination with one or the other of the stages 29 or 29' to obtain any desired phase shift from 0° to 315°. Similarly, if stage 31 becomes stuck at 90°, a total of 270° phase shift can be obtained by switching stages 29 and 31' to 180° and 90°, respectively, to combine with stuck stage 31 to yield 360° (or 0°). To obtain 45° total phase, the stage 33 would then be switched to 45°; for 90°, the stuck stage 31 would be used alone, etc. The corporate feed 55 of FIG. 2 may be connected to radar circuitry as shown in FIG. 1.

Each of the elementary phase shifter stages of FIG. 2 include an output indicator lead 64 which indicates the state of that stage, for example a binary 1 on lead 64 might indicate that the stage is set at its non-zero value and a binary 0 would indicate zero phase. This lead can then provide an indication of whether the stage is properly operating, and if it is stuck, the state of the signal on lead 64 will indicate at which phase the stage is stuck. This information is used by the control circuit of FIG. 3 to change the sequence of operation of the other phase shifter stages to compensate for one or more stuck stages.

Figure 3:
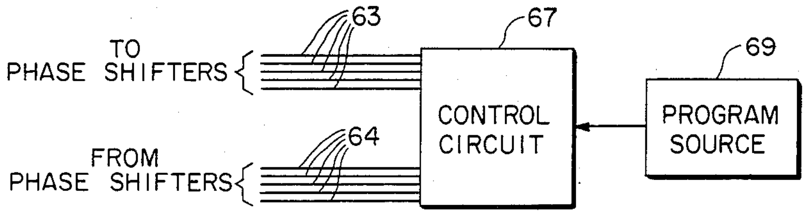
FIG. 3 is a diagram of control circuitry for the phase shifters of the present invention.

FIG. 3 is a block diagram of one form of control circuitry. It comprises a control circuit 67 which is connected to each one of the elementary phase shifter stages of FIG. 3 by means of control leads 63. The indicator leads 64 from each of the elementary stages are all connected to circuit 67, as ilustrated. A program source 69 is connected to the control circuit 67. The program of circuit 69 can be varied to produce different desired scanning patterns. The program source may be a computer, a keyboard, or a tape unit in which a program is stored, as well as an algorithm which determines how the circuitry is re-programmed in the event of phase shifter failures of the type discussed above. The control circuitry can be arranged to periodically interchange the use of the basic and redundant circuits to check on the operability of all circuits and also prolong the circuit life.

Figure 4:
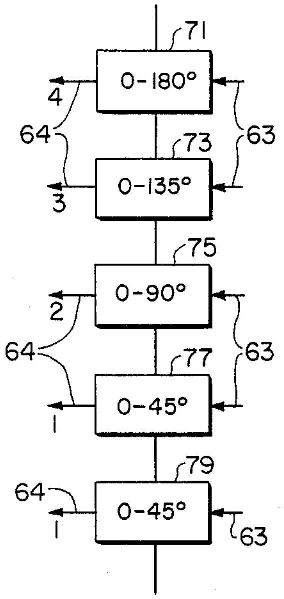
FIG. 4 shows an alternative type of three stage binary digital phase shifter.

FIG. 4 shows an alternative type of three stage phase shifter which may be substituted for the illustrated three stage redundant phase shifters connected to the center antenna elements 11 and 13 of FIG. 2. This alternative phase shifter has only five elementary phase shifter stages rather than the six stages shown in FIG. 2. The stages, as shown, have phase shifts of 0°–180°, 0°–135°, 0°–90°, and two stages of 0°–45°, for the stages referenced respectively as 71, 73, 75, 77 and 79. These stages are provided with control leads 63 and indicator leads 64. The five stage phase shifter of FIG. 4 will perform with any one stage thereof stuck at either value. If stage 71 is stuck at 0° or 180°, the other stages can compensate for it, since the remaining operative stages 73, 75, 77, 79 can assume all total phase values from 0° to 315° in increments of 45°. If the stages are assigned numerals proportional to their non-zero phase values as shown to the left of the stages in FIG. 4, the numerals of all stages at their non-zero phases can be added to quickly determine whether any group of stages can provide a complete sequence of phase values. In a three stage binary phase shifter, there are 8 different total phases from 0° to 315° in 45° increments. Thus assume that the stage 71 is stuck at 0°, then the sequence of stage operation to go through all eight total phases would be as follows: 0°, all stages "off"; 45°, 77 or 79 "on", rest "off"; 90°, 75 "on", rest "off", or 77 and 79 "on", rest "off"; 135°, 73 "on", rest "off" or 75 and either 77 or 79 "on", rest "off"; 180°, 73 and either 77 or 79 "on", rest "off"; 225°, 73 and 75 "on", rest "off" or 73, 77 and 79 "on", rest "off"; 270°, 73, 75 and either 77 or 79 "on", rest "off"; 315°, 73, 75, 77 and 79 "on", 71 stuck "off". If any of the stages are stuck at 0°, the numerals 1–4 can be used to conveniently determine whether the remaining stages can compensate for the stuck stage and which stages must be switched to accomplish any given total phase. For example, if the stage 75 is stuck at 0°, this stage and its numeral "2" are ineffective but the numerals of the other stages will provide a sequence from 1 to 8 indicating that the stuck stage 75 can be compensated for.

Thus this embodiment achieves redundant operation with only five stages. In this circuit, all of the stages have non-zero phases which are integral multiples of the least significant phase bit (0°–45°), but not all are in the 2 to 1 ratio of a conventional binary digital phase shifter.

It can be shown that if any of the stages 73, 75, 77 or 79 becomes stuck at its non-zero value, this can also be compensated for. For example if stage 75 is stuck at 90°, 0° total phase would be obtained by switching "on" stages 71, 73 and either 77 or 79 to obtain 360° (or 0°), then adding either 77 or 79 to obtain 45°, then leaving stuck stage 75 "on" with all other stages "off" to obtain 90°, then 75 plus either 77 or 79 for 135°; 75, 77 and 79 for a total of 180°; 73 and 75 for a total of 225°; 71 and 75 for a total of 270°; and finally 71, 75 and either 77 or 79 for a total of 315°. The least significant phase bit need not be a submultiple of 360° which is an integral power of 2, for example if the submultiple factor is ⅓, the least significant bit would be 120°.

If in the embodiments of FIGS. 1 or 2 there should be a failure of any of the phase shifters wherein one of the phase shifters and hence the antenna elements connected thereto should become stuck at any fixed phase, this element can be regarded as the reference element and the phases of the other antenna elements re-adjusted relative thereto. This method of compensation is disclosed and claimed in a co-pending application of the present inventor and William Fishbein, Ser. No. 105,475, filed Aug. 5, 1982.

Also should there be a failure in the circuit of FIG. 2 wherein all of the redundant stages of a phase shifter connected to an antenna element and at least one of the basic stages of the same phase shifter are stuck, this antenna element is left at a fixed phase and the other elements re-adjusted relative thereto. Also, as explained in the aforementioned co-pending application, if two phase shifters connected to different antenna elements fail and the redundant stages cannot provide compensation, it may be advantageous to shut off one of the antenna elements with the failed phase shifter.

Practical antenna arrays of this type would normally comprise many more radiators, for example 100 radiators per array with the center radiators having digital phase shifters with up to eight stages and the number of stages tapering down toward the end elements.

Also, a practical array may comprise many more radiators for each of the three energy levels, all with phase shifters with the same number of stages. For example, there might be 8 center antenna elements with the same high power level and all with 3 stage phase shifters, with 6 intermediate power antenna elements on either side of the center elements and all with 2 stage phase shifters, and with 5 low power antenna elements at either end of the array, all with single stage phase shifters.

More than one type of intermediate antenna elements can be provided, for example each different type comprising phase shifters with different numbers of stages.

Figure 5:
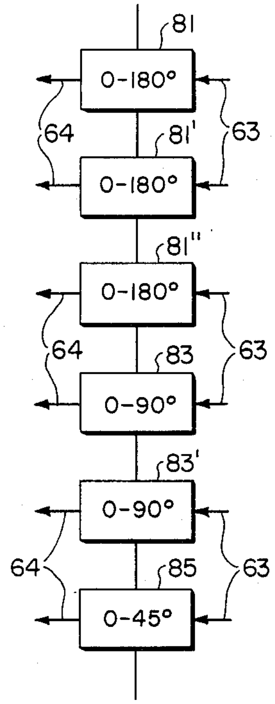
FIGS. 5, 6 and 7 show different types of redundant digital phase shifters with three, two and one stage, respectively.
Figure 6:
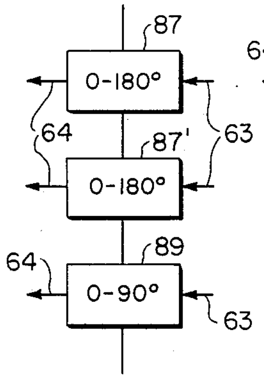
Figure 7:
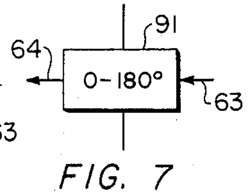

Also, phase shifters may be provided with more redundant stages for the more significant phase bits, since these phase bits are more effective in contributing to the total phase shift, and hence the reliability of these stages is more critical to overall phase shifter performance. Examples of such phase shifters with a tapered number of redundant stages are shown in FIGS. 5, 6, and 7. The three stage phase shifter of FIG. 5 comprises one basic 0°–180° stage 81 and first and second redundant 0°–180° stages 81' and 81''. Two 0°–90° stages are provided, 83 and 83', and only a single 0°–45° stage, 85. With such a three stage phase shifter, two out of the three most significant phase bit stages can fail by becoming stuck at either phase value, and the remaining 0°–180° stage can provide all the required phases in conjunction with the two stuck stages. For example if two of the three 0°–180° stages become stuck at either 0° or 180°, there are four combinations of stuck phases for the two stuck stages, namely, 0° and 0°, 0° and 180°, 180° and 0°, and 180° and 180°. The last of these, 180° and 180° is the same as 0°, and the two middle combinations are the same namely 180°. Thus any combination of the two such stuck stages are the equivalent of a single 0°–180° elementary phase shifter stage which is stuck at either 0° or 180°, and such a single stuck phase shifter can be 100% compensated for by a single operable similar stage, as was explained in connection with FIGS. 1 and 2. Since two 0°–90° stages are provided, 100% compensation can be achieved if either one becomes stuck at either of its phases. Only a single stage of the least significant phase bit 0°–45° is provided since it may in some cases be preferable to risk a 45° phase error rather than provide a redundant stage for this element.

FIG. 6 shows a two stage phase shifter embodying the same principle by providing a redundant stage 87' in addition to the basic stage 87 of the most significant phase bit of 0°–180°, but only a single stage 89 for the least significant bit of 0°–90°. The single stage phase shifter of FIG. 7 would be used for the low energy end radiators of arrays with tapered redundant stages such as those of FIGS. 5 and 6 in the higher energy antenna elements. If the single stage 91 became stuck it could be either left "on" and the other phase shifters adjusted relative thereto, as explained above, or if this is not feasible, this antenna radiator could be shut down if this improves the overall antenna performance. Also, some other radiator could be shut down and the radiator with the stuck phase shifter left "on", if this results in improved performance.

An antenna or radar system which would utilize phase shifters such as those of FIGS. 5, 6 and 7 might be one wherein the system is designed with a large safety factor as far as antenna pattern and phase accuracy is concerned and hence could tolerate the phase errors caused by the failure of the elementary phase shifters of lesser significance.

In other cases where a system is designed to barely meet phase shifter accuracy and resolution specifications, two design philosophies are possible. One would be to use high reliability components which minimize the risk of component and hence system failure. The alternative design philosophy would be to utilize inexpensive components with overall high reliability provided by redundancy, as taught by the present invention.

The concept of this invention can be also applied to more complex phased arrays such as two dimensional arrays, for example planar arrays.

While the invention has been described in connection with illustrative embodiments, obvious variations therein will occur to those skilled in the art, accordingly the invention should be limited only by the scope of the appended claims.

I claim:

1. A steerable linear phased array antenna of the tapered type comprising a plurality of radiators, in which the energy applied to the center radiators is a maximum and the radiator energy is tapered off toward both ends of said array to reduce antenna pattern sidelobes, each of said radiators being provided with a binary digital phase shifter each comprising one or more elementary binary phase shifter stages connected in series, each of said phase shifter stages being capable of assuming either zero phase shift or 180° phase shift, or some submultiple of 180° which is an integral power of 2, whereby by selectively controlling the phase shifts of said elementary phase shifters, $2^n$ different total phase shifts may be obtained, wherein "n" is the number of elementary phase shifter stages per antenna radiator, and wherein the said maximum energy center radiators are provided with a greater number of stages of said elementary phase shifters than are the lower energy radiators on either side thereof.

2. The antenna of claim 1 wherein each of said elementary phase shifter stages has a control lead and an indicator lead connected thereto from a control circuit, and wherein said control circuit has a program source connected thereto.

3. The antenna of claim 1 wherein each of the elementary phase shifters of a given phase value is duplicated by a redundant stage of the same phase value, whereby up to 50% of all phase shifter stages may fail and the remaining stages can be operated to compensate for said failed stages.

4. In a steerable linear phased array antenna of the tapered type and which includes a plurality of radiators,—each radiator being provided with a binary digital phrase shifter each of which comprises one or more elementary binary shifter stages in series, wherein maximum energy center radiators are provided with a greater number of stages of said elementary phase shifters than are the lower energy radiators on either side thereof,—the improvement comprising a binary phase shifter with redundant stages of elementary phase shifters wherein the number of such redundant stages is larger for the phase bits of most significance and tapers down to a smaller number of stages for the phase bits of least significance.

5. A tapered linear phased array antenna for a radar set including a transmitter and a receiver, comprising six or more radiators arranged in a line with binary digital phase shifters connected to each said radiator, and two or more center radiators having maximum transmitter energy applied thereto with the two or more end radiators having minimum energy applied thereto and the two or more intermediate radiators having intermediate transmitter energies applied thereto, whereby the phase shifters connected to said two or more center radiators have a maximum number of stages in the said phase shifter thereof, with the number of phase shifter stages and hence the phase accuracy tapering off toward the radiators at either end of said array.

6. The antenna of claim 5 wherein each of said binary digital phase shifters comprises a set of basic elementary phase shifter stages plus a duplicate set of redundant elementary phase shifter stages.

7. The antenna of claim 5 wherein said phase shifters of said two or more center radiators comprises three stages of elementary phase shifters having phase shifts of 0°-180°, 0°-90°, and 0°-45°, the said two or more intermediate radiators having two stages of elementary phase shifters having phase shifts 0°-180° and 0°-90°, and said two or more end radiators have phase shifters comprising a single stage with phase shifts of 0°-180°.

8. The antenna of claim 5 wherein said phase shifters of said two or more center radiators comprise "n" stages of elementary phase shifters having phase shifts of; $0°-360°/2^1$, $0°-360°/2^2$, $0°-360°/2^3$, - - - , $0°-360°/2^n$, the said two or more intermediate radiators having $m<n$ stages of elementary phase shifters having phase shifts of; $0°-360°/2^1$, $0°-360°/2^2$, $0°-360°/2^3$, - - - , $0°-360°/2^m$, and the said two or more end radiators having phase shifters comprising less than m stages.

* * * * *